United States Patent [19]
Bonnot et al.

[11] Patent Number: 5,675,585
[45] Date of Patent: Oct. 7, 1997

[54] METHOD AND SYSTEM FOR INTERLEAVING AND DEINTERLEAVING SDH FRAMES

[75] Inventors: Christophe Bonnot, Sevres; Bertrand Gerbault, Paris; Jean-Christophe Seguy, Fontenay aux Roses, all of France

[73] Assignee: Alcatel Telspace, Nanterre Cedex, France

[21] Appl. No.: 507,141

[22] Filed: Jul. 26, 1995

[30] Foreign Application Priority Data

Jul. 29, 1994 [FR] France .................. 94 09427

[51] Int. Cl.$^6$ .................. H04J 3/07; H03M 13/22
[52] U.S. Cl. .................. 371/2.1; 370/506; 371/36
[58] Field of Search .................. 371/2.1

[56] References Cited

U.S. PATENT DOCUMENTS

| | | | |
|---|---|---|---|
| 4,559,625 | 12/1985 | Berlekamp et al. | 371/2.1 |
| 5,018,132 | 5/1991 | Williams et al. | 370/476 |
| 5,033,044 | 7/1991 | Williams et al. | 370/510 |

OTHER PUBLICATIONS

*Third European Conference on Radio Relay Systems*, 17 Dec. 1991-20 Dec. 1991, Paris, France, pp. 64-71, A. Berndt et al, "Introduction of STM-1 Transmission on Digital Radio-Relay Systems Using 40 MHZ and About 30 MHZ Channel Spacing".

*Electronics Letters*, vol. 28, No. 4, 13 Feb. 1992, pp. 427-428, XP 000292312, Matsuoka S. et al, "64-Channel Byte Interleaver for Gigabit Transmission Systems".

*Primary Examiner*—Stephen M. Baker
*Attorney, Agent, or Firm*—Sughrue, Mion, Zinn, Macpeak, and Seas

[57] ABSTRACT

In a method of interleaving and deinterleaving STM-1 and STM-N SDH frame pointers transmitted between a transmitter and a receiver, each frame comprising a section overhead area, a pointer area and a payload area including the data to be transmitted. At the transmitter, the bits of the pointer area and those of the payload area are interleaved according to an interleaving law retaining the position modulo 24 in the interleaved bits. The interleaving produces an interleaved frame transmitted to the receiver at which it is deinterleaved using a law that is the reciprocal of the interleaving law. This interleaves all the bits of pointers in the frame without changing the values of the B1 and B2 parity control bytes.

9 Claims, 8 Drawing Sheets

| | 1 | | | | | 24 | | | |
|---|---|---|---|---|---|---|---|---|---|
| 1 | 1 | 2 | 3 | 4 | | 21 | 22 | 23 | 24 |
| | 25 | 26 | 27 | 28 | | 45 | 46 | 47 | 48 |
| | 49 | 50 | 51 | 52 | | 69 | 70 | 71 | 72 |
| | | | | | | | | | |
| | 2017 | 2018 | 2019 | 2020 | | 2037 | 2038 | 2039 | 2040 |
| | 2041 | 2042 | 2043 | 2044 | | 2061 | 2062 | 2063 | 2064 |
| 87 | 2065 | 2066 | 2067 | 2068 | | 2085 | 2086 | 2087 | 2088 |

| | 1 | | | | | 24 | | | |
|---|---|---|---|---|---|---|---|---|---|
| 1 | 1 | 2 | 3 | 4 | | 21 | 22 | 23 | 24 |
| | 25 | 26 | 27 | 28 | | 45 | 46 | 47 | 48 |
| | 49 | 50 | 51 | 52 | | 69 | 70 | 71 | 72 |
| | | | | | | | | | |
| | 2089 | 2090 | 2091 | 2092 | | 2109 | 2110 | 2111 | 2112 |
| | 2113 | 2114 | 2115 | 2116 | | 2133 | 2134 | 2135 | 2136 |
| 90 | 2137 | 2138 | 2139 | 2140 | | 2157 | 2158 | 2159 | 2160 |

FIG. 8

|    | 1    | 2    | 3    | 4    | 5    | 6    | 7    | 8    |
|----|------|------|------|------|------|------|------|------|
| 1  | 1    | 26   | 51   | 76   | 101  | 126  | 151  | 176  |
| 2  | 601  | 626  | 651  | 676  | 701  | 726  | 751  | 776  |
| 3  | 1201 | 1226 | 1251 | 1276 | 1301 | 1326 | 1351 | 1376 |
| 4  | 1801 | 1826 | 1851 | 1876 | 1901 | 1926 | 1951 | 1976 |
| 5  | 313  | 338  | 363  | 388  | 413  | 438  | 463  | 488  |
| 6  | 913  | 938  | 963  | 988  | 1013 | 1038 | 1063 | 1088 |
| 7  | 1513 | 1538 | 1563 | 1588 | 1613 | 1638 | 1663 | 1688 |
| 8  | 25   | 50   | 75   | 100  | 125  | 150  | 175  | 200  |
| 9  | 625  | 650  | 675  | 700  | 725  | 750  | 775  | 800  |
| 10 | 1225 | 1250 | 1275 | 1300 | 1325 | 1350 | 1375 | 1400 |
| 11 | 1825 | 1850 | 1875 | 1900 | 1925 | 1950 | 1975 | 2000 |
| 12 | 337  | 362  | 387  | 412  | 437  | 462  | 487  | 512  |
| 13 | 937  | 962  | 987  | 1012 | 1037 | 1062 | 1087 | 1112 |
| 14 | 1537 | 1562 | 1587 | 1612 | 1637 | 1662 | 1687 | 1712 |
| 15 | 49   | 74   | 99   | 124  | 149  | 174  | 199  | 224  |
| 16 | 649  | 674  | 699  | 724  | 749  | 774  | 799  | 824  |
| 17 | 1249 | 1274 | 1299 | 1324 | 1349 | 1374 | 1399 | 1424 |
| 18 | 1849 | 1874 | 1899 | 1924 | 1949 | 1974 | 1999 | 2024 |
| 19 | 361  | 386  | 411  | 436  | 461  | 486  | 511  | 536  |
| 20 | 961  | 986  | 1011 | 1036 | 1061 | 1086 | 1111 | 1136 |
| 21 | 1561 | 1586 | 1611 | 1636 | 1661 | 1686 | 1711 | 1736 |
| 22 | 73   | 98   | 123  | 148  | 173  | 198  | 223  | 248  |
| 23 | 673  | 698  | 723  | 748  | 773  | 798  | 823  | 848  |
| 24 | 1273 | 1298 | 1323 | 1348 | 1373 | 1398 | 1423 | 1448 |
| 25 | 1873 | 1898 | 1923 | 1948 | 1973 | 1998 | 2023 | 2048 |
| 26 | 385  | 410  | 435  | 460  | 485  | 510  | 535  | 560  |
| 27 | 985  | 1010 | 1035 | 1060 | 1085 | 1110 | 1135 | 1160 |
| 28 | 1585 | 1610 | 1635 | 1660 | 1685 | 1710 | 1735 | 1760 |
| 29 | 97   | 122  | 147  | 172  | 197  | 222  | 247  | 272  |
| 30 | 697  | 722  | 747  | 772  | 797  | 822  | 847  | 872  |
| 31 | 1297 | 1322 | 1347 | 1372 | 1397 | 1422 | 1447 | 1472 |
| 32 | 1897 | 1922 | 1947 | 1972 | 1997 | 2022 | 2047 | 2072 |
| 33 | 409  | 434  | 459  | 484  | 509  | 534  | 559  | 584  |
| 34 | 1009 | 1034 | 1059 | 1084 | 1109 | 1134 | 1159 | 1184 |
| 35 | 1609 | 1634 | 1659 | 1684 | 1709 | 1734 | 1759 | 1784 |
| 36 | 121  | 146  | 171  | 196  | 221  | 246  | 271  | 296  |
| 37 | 721  | 746  | 771  | 796  | 821  | 846  | 871  | 896  |
| 38 | 1321 | 1346 | 1371 | 1396 | 1421 | 1446 | 1471 | 1496 |
| 39 | 1921 | 1946 | 1971 | 1996 | 2021 | 2046 | 2071 | 8    |
| 40 | 433  | 458  | 483  | 508  | 533  | 558  | 583  | 608  |

FIG. 9

| | 1 | 2 | 3 | 4 | 5 | 6 | 7 | 8 |
|---|---|---|---|---|---|---|---|---|
| 1 | 1 | 26 | 51 | 76 | 101 | 126 | 151 | 176 |
| 2 | 601 | 626 | 651 | 676 | 701 | 726 | 751 | 776 |
| 3 | 1201 | 1226 | 1251 | 1276 | 1301 | 1326 | 1351 | 1376 |
| 4 | 1801 | 1826 | 1851 | 1876 | 1901 | 1926 | 1951 | 1976 |
| 5 | 241 | 266 | 291 | 316 | 341 | 366 | 391 | 416 |
| 6 | 841 | 866 | 891 | 916 | 941 | 966 | 991 | 1016 |
| 7 | 1441 | 1466 | 1491 | 1516 | 1541 | 1566 | 1591 | 1616 |
| 8 | 2041 | 2066 | 2091 | 2116 | 2141 | 6 | 31 | 56 |
| 9 | 481 | 506 | 531 | 556 | 581 | 606 | 631 | 656 |
| 10 | 1081 | 1106 | 1131 | 1156 | 1181 | 1206 | 1231 | 1256 |
| 11 | 1681 | 1706 | 1731 | 1756 | 1781 | 1806 | 1831 | 1856 |
| 12 | 121 | 146 | 171 | 196 | 221 | 246 | 271 | 296 |
| 13 | 721 | 746 | 771 | 796 | 821 | 846 | 871 | 896 |
| 14 | 1321 | 1346 | 1371 | 1396 | 1421 | 1446 | 1471 | 1496 |
| 15 | 1921 | 1946 | 1971 | 1996 | 2021 | 2046 | 2071 | 2096 |
| 16 | 361 | 386 | 411 | 436 | 461 | 486 | 511 | 536 |
| 17 | 961 | 986 | 1011 | 1036 | 1061 | 1086 | 1111 | 1136 |
| 18 | 1561 | 1586 | 1611 | 1636 | 1661 | 1686 | 1711 | 1736 |
| 19 | 25 | 50 | 75 | 100 | 125 | 150 | 175 | 200 |
| 20 | 625 | 650 | 675 | 700 | 725 | 750 | 775 | 800 |
| 21 | 1225 | 1250 | 1275 | 1300 | 1325 | 1350 | 1375 | 1400 |
| 22 | 1825 | 1850 | 1875 | 1900 | 1925 | 1950 | 1975 | 2000 |
| 23 | 265 | 290 | 315 | 340 | 365 | 390 | 415 | 440 |
| 24 | 865 | 890 | 915 | 940 | 965 | 990 | 1015 | 1040 |
| 25 | 1465 | 1490 | 1515 | 1540 | 1565 | 1590 | 1615 | 1640 |
| 26 | 2065 | 2090 | 2115 | 2140 | 5 | 30 | 55 | 80 |
| 27 | 505 | 530 | 555 | 580 | 605 | 630 | 655 | 680 |
| 28 | 1105 | 1130 | 1155 | 1180 | 1205 | 1230 | 1255 | 1280 |
| 29 | 1705 | 1730 | 1755 | 1780 | 1805 | 1830 | 1855 | 1880 |
| 30 | 145 | 170 | 195 | 220 | 245 | 270 | 295 | 320 |
| 31 | 745 | 770 | 795 | 820 | 845 | 870 | 895 | 920 |
| 32 | 1345 | 1370 | 1395 | 1420 | 1445 | 1470 | 1495 | 1520 |
| 33 | 1945 | 1970 | 1995 | 2020 | 2045 | 2070 | 2095 | 2120 |
| 34 | 385 | 410 | 435 | 460 | 485 | 510 | 535 | 560 |
| 35 | 985 | 1010 | 1035 | 1060 | 1085 | 1110 | 1135 | 1160 |
| 36 | 1585 | 1610 | 1635 | 1660 | 1685 | 1710 | 1735 | 1760 |
| 37 | 49 | 74 | 99 | 124 | 149 | 174 | 199 | 224 |
| 38 | 649 | 674 | 699 | 724 | 749 | 774 | 799 | 824 |
| 39 | 1249 | 1274 | 1299 | 1324 | 1349 | 1374 | 1399 | 1424 |
| 40 | 1849 | 1874 | 1899 | 1924 | 1949 | 1974 | 1999 | 2024 |

FIG. 10A

| H1 | Y | Y | H2 | 1 | 1 | H3 | H3 | H3 |

FIG. 10B

| H1 | H1 | H1 | H2 | H2 | H2 | H3 | H3 | H3 |

FIG. 11A

| 4-1 | 4-2 | 4-3 | 4-4 | 4-5 | 4-6 | 4-7 | 4-8 | 4-9 |

FIG. 11B

| 4-1 | 4-4 | 4-7 | 4-2 | 4-5 | 4-8 | 4-3 | 4-6 | 4-9 |

FIG. 12A

| H1 | H2 | H3 | Y | 1 | H3 | Y | 1 | H3 |

FIG. 12B

| H1 | H2 | H3 | H1 | H2 | H3 | H1 | H2 | H3 |

METHOD AND SYSTEM FOR INTERLEAVING AND DEINTERLEAVING SDH FRAMES

BACKGROUND OF THE INVENTION

1. Field of the Invention

The field of the invention is that of methods for interleaving and deinterleaving SDH (Synchronous Digital Hierarchy) frames and the invention is more particularly concerned with a method of this kind that makes parity control bytes of such frames transparent to the interleaving operation. The invention also concerns an interleaving and deinterleaving system using a method of this kind.

2. Description of the Prior Art

FIG. 1 shows a basic frame transmitted in an SDH network. This STM-1 frame transports a VC-4 virtual container and contains 2 430 bytes divided into nine rows each of 270 bytes. It comprises three areas:

a section overhead (SOH) area;

an area PT including pointers;

a payload area essentially containing the data to be transmitted.

STM-1 frames provide a transmission bit rate of 155 Mbit/s.

The section overhead SOH is contained in bytes 1 through 9 of rows 1 through 3 and 5 through 9. The pointer area PT occupies bytes 1 through 9 of the fourth row of the STM-1 frame. The payload area occupies bytes 9 through 270 of rows 1 through 9. All these bytes are read from left to right and from top to bottom.

The function of the pointers is to indicate the position of the various tributary signals in the payload area to enable frame alignment problems to be solved without using buffer memory.

FIG. 2 shows the structure of the SOH. The SOH is made up of a regenerator section overhead (RSOH) and a multiplexing section overhead (MSOH).

The RSOH is accessible at all repeaters and comprises:

frame alignment bytes A1 (11110110) and A2 (00101000) constituting a frame alignment word;

an identification byte C1 for identifying the position of a demultiplexed signal (extraction of one byte in N) in the STM-N frame (high bit rate frame at N times 155 Mbit/s);

an 8th bit interleaving parity calculation byte B1 used for error location within a regeneration section;

bytes E1 and F1 respectively reserved for an order wire and a user channel;

bytes D1 through D3 which form a 192 kbit/s data channel.

The MSOH is accessible at the terminations of a multiplexing section and comprises:

bytes B2.1, B2.2, B2.3 used to measure the quality of the multiplexing section;

bytes K1 and K2 used for administration of automatic section protection;

bytes D4 through D12 forming a 576 kbit/s data channel; reserved bytes Z1 and Z2;

a byte E2 forming a 64 kbit/s order wire.

Bytes marked with an X are reserved for international use and bytes B1, B2.1, B2.2 and B2.3 of a given frame i constitute parity control bytes of the frame i-1 preceding frame i. To be more precise, a parity control byte in frame i is the sum of the bytes in frame i-1, including the corresponding parity control byte in frame i-1.

FIG. 3 shows the multiplexing structure of an STM-1 frame in accordance with CCITT Recommendation G.709. This multiplexing structure includes a plurality of plesiochronous tributaries at different bit rates each linked to a C-i container constituting envelopes of digital signals transported. These containers are connected to virtual containers VC-i each made up of a container and an overhead. The virtual containers VC-i cooperate with tributary units TU-i comprising a lower order virtual container and its associated pointer. The TUG-i are tributary unit groups which represent a virtual structure of the frame enabling multiplexing of TU-i of different sizes. The AU-i are administrative units which are multiplexed to constitute an STM-1 frame. N interleaved STM-1 frames constitute an STM-N frame which is transmitted to a receiver over a microwave link or a physical line (cable, optical fiber, etc).

When digital information is transmitted using error correcting codes, as in the SDH system, errors that cannot be corrected sometimes cause the formation of error packets with lengths exceeding a few tens of bits. Accordingly, an error packet can form in the pointer area, preventing access to the tributary whose position in the frame is indicated by the pointer.

Japanese patent application n° 5-344089 in the name of NEC describes a method of interleaving the pointer of the VC-4 virtual container. This pointer comprises three bytes H1, H2, H3 divided between a group of nine consecutive bytes at the start of the fourth row of the STM-1 frame. The objective of interleaving as proposed in this patent application is to dilute the pointer bits. This interleaving is associated with an error correcting code generating extra-bits. This method has a number of drawbacks:

it uses for the extra-bits SOH locations that are not standardized at present but which may be standardized in the future; future standardization action could therefore render this method inapplicable;

it does not allow for any pointers that may be present in the payload area. These pointers are used, among other things, to indicate the position of the VC-31 and VC-32 virtual containers in the AU-4 and AU-31 administrative units. They are disposed in columns of bytes so that there is only one byte per row. To be more precise, these three bytes are consecutive and written into columns 11, 12, 13 and 14 of the STM-1 frame, starting from the first row, to transport four VC-31 virtual containers and also consecutive and written into columns 13, 14 and 15 of the STM-1 frame from the first row to transport three VC-32 virtual containers.

Furthermore, in the case of multiframe transport, the pointers occupy only one byte per frame.

One object of the invention is to provide an SDH frame interleaving method and system (implemented at a transmitter) and an SDH frame deinterleaving method and system (implemented at a receiver) that do not suffer from the aforementioned drawbacks.

To be more precise, one object of the invention is to interleave an SDH frame in such a way that no loss of pointer occurs if an error packet having a length less than a predefined length Lmax is produced at the location of that pointer. In accordance with a predefined specification, it must be possible to reconstitute the pointer at the receiver even if an error packet having a length of less than Lmax=80 bits is produced.

Another object of the invention is to achieve this interleaving without corrupting the value of the parity control byte B1 or the value of the 24-tuplet B2.1, B2.2, B2.3.

SUMMARY OF THE INVENTION

The above objects, and others that emerge below, are achieved by a method of interleaving and deinterleaving STM-1 and STM-N SDH frame pointers transmitted between a transmitter and a receiver, each frame comprising three areas:

a section overhead area;

a pointer area;

a payload area including the data to be transmitted, in which method, at said transmitter, said interleaving consists in interleaving the bits of said pointer area and those of said payload area according to an interleaving law retaining the position modulo 24 in the interleaved bits, said interleaving producing an interleaved frame transmitted to said receiver at which said interleaved frame is deinterleaved using a law that is the reciprocal of said interleaving law.

In this way the bits of all the pointers in an STM-1 or STM-N frame are interleaved without corrupting the value of the parity control bytes.

In one advantageous embodiment of the method of the invention, the interleaving is associated with compacting of said pointer area in accordance with a compacting law by modifying the position of at least two bytes of said pointer area so that after interleaving and compacting each pair of bits of said pointer is separated by at least the length of an error packet that the transmission can withstand without any pointer errors, said interleaving being associated with decompacting in accordance with a law that is the reciprocal of the compacting law.

This allows for a specific disposition of the pointer bytes in the pointer area.

Note that a pointer error occurs if more than one bit is invalid. If a single bit of the pointer received is invalid, the majority coding imposed by the SDH standard enables its correct value to be found.

The method of the invention advantageously includes a step of correcting the 24-tuplet B2 after compacting and interleaving and after decompacting and deinterleaving to remedy corruption of that byte due to compacting.

The invention also consists in an SDH frame pointer interleaving and deinterleaving system using the above method and a corresponding transmitter and receiver.

Other features and advantages of the invention will emerge from a reading of the following description of one advantageous embodiment of the invention given by way of non-limiting illustrative example only with reference to the appended drawings.

BRIEF DESCRIPTION OF THE DRAWINGS

FIGS. 8 and 9 show parts of tables resulting from interleaving in accordance with the invention.

FIGS. 10A through 12B show various arrangements of the pointer area PT.

DETAILED DESCRIPTION OF THE PREFERRED EMBODIMENTS

Figures 1, 2:
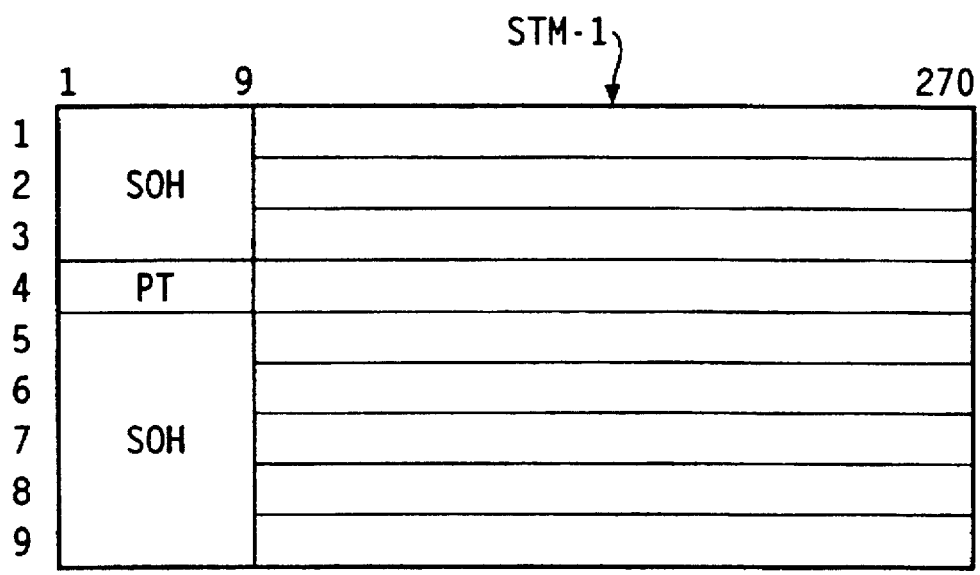
FIG. 1 shows a basic frame transmitted in an SDH network and transporting a VC-4 virtual container.
FIG. 2 shows the structure of the SOH of the basic frame.
Figure 3:
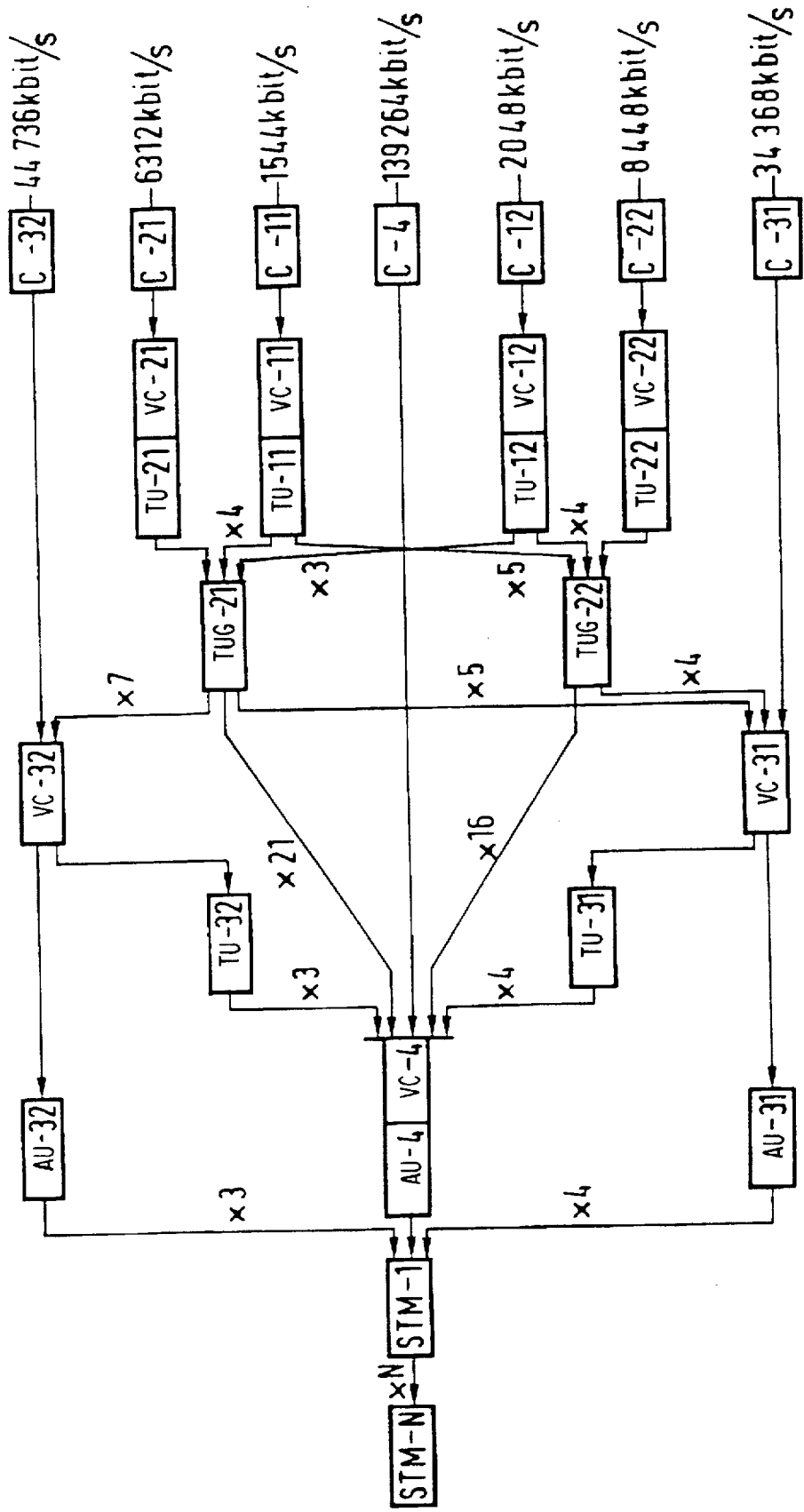
FIG. 3 shows the multiplexing structure of an STM-1 frame in accordance with CCITT Recommendation G.709.

FIGS. 1 through 3 have already been described in relation to the prior art.

Figures 4, 5, 6:
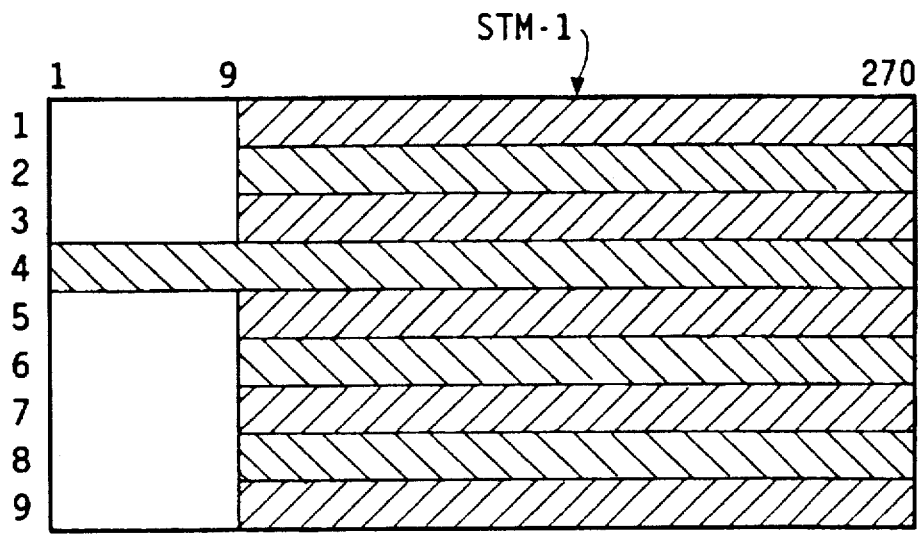
FIG. 4 shows an STM-1 frame in which the areas interleaved by the method of the invention are emphasized.
FIGS. 5 and 6 are tables showing the natural order of the bits to be interleaved when placed in tables of 24 columns and 87 and 90 rows, respectively, for specific interleaving of the 4th row of the STM-1 frame.

In FIG. 4, the area of an STM-1 frame that is interleaved by the invention is shaded. This area comprises rows 1 through 3 and 5 through 9 of the payload area and all of row 4 of the STM-1 frame. Interleaving all these bits necessarily enables interleaving those of all pointers in this frame.

The problem arising from interleaving is that it must not corrupt the parity control bytes B1 and B2.1, B2.2 and B2.3. Accordingly, interleaving must respect the position of the bits modulo 24 in the interleaving frame such that the 24-tuplet B2.1, B2.2 and B2.3 is not corrupted. Respecting the position of the bits modulo 24 necessarily respects the position of the bits modulo 8 and so interleaving that does not corrupt this 24-tuplet does not corrupt the byte B1 either.

In a preferred embodiment of the method of the invention, and as shown in FIG. 4, interleaving is effected row by row. In this way, the 2 088 bits of each of rows 1 through 3 and 5 through 9 are interleaved independently and likewise the 2 160 bits of row 4.

The tables in FIGS. 5 and 6 show the natural order of the bits to be interleaved when placed in tables of 24 columns by 87 and 90 rows, respectively. The FIG. 5 table contains 2 088 bits and the FIG. 6 table contains 2 160 bits.

Figure 7:
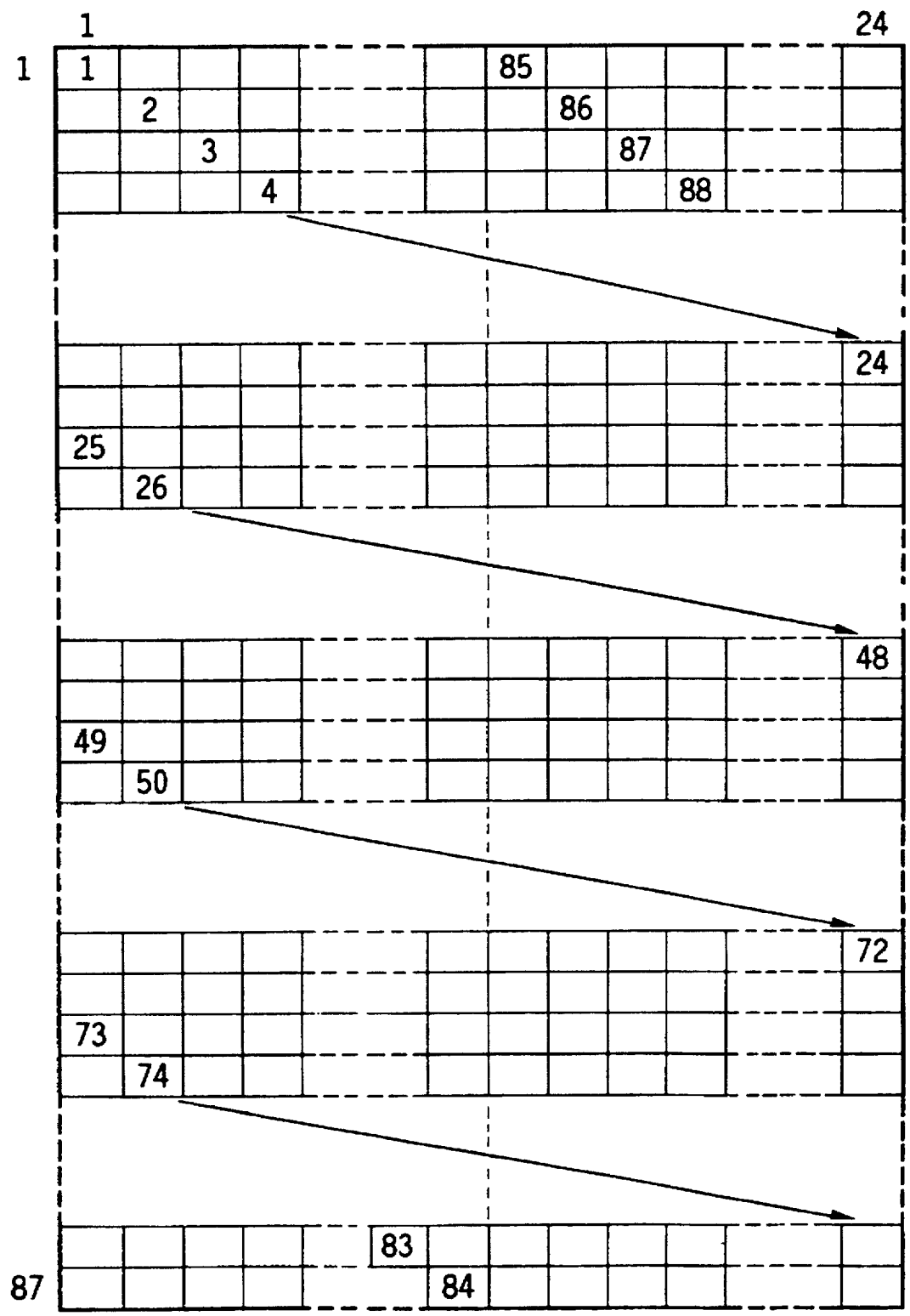
FIG. 7 shows the order in which the table from FIG. 5 is read in one preferred embodiment of the method of the invention.

After placing the bits of each row to be interleaved in these tables, interleaving in accordance with the invention can simply entail reading the tables in the manner shown in FIG. 7.

FIG. 7 shows the order of reading the FIG. 5 table. This reading is diagonal, i.e. the first bit read is that of the 1st row in the 1st column, the second bit read is that of the 2nd row in the 2nd column, and so on up to the 24th row in the 24th column. Reading then continues from the 26th row in the 1st column, rather than the 25th row, to respect a gap of 24 bits between bits 576 (24×24) and 577. On reaching the 87th row (to read the 84th bit), reading continues from the 1st row of the 13th column.

FIG. 8 shows part of the table resulting from such interleaving. It shows eight of 24 columns and 40 of 87 rows.

This table is then read row by row to place the corresponding bits into a frame constituting the interleaved frame.

Note that the location of the bits modulo 24 is respected: for example, column 1 of the FIG. 8 table includes all bits at position 1 modulo 24 up to bit 1 489. These bits also appear in column 1 of the FIG. 5 table.

A table corresponding to that of FIG. 6 is read in the same order as that of FIG. 7, except that the table has 90 rows instead of 87, because of the presence of the 72 bits of the pointer PT. FIG. 9 shows part of the table resulting from such interleaving. It shows eight of 24 columns and 40 of 90 rows. This table is then read row by row to place the corresponding bits in the interleaved frame. As previously, column 1 of the FIG. 9 table includes all the bits at position 1 modulo 24 up to bit 2 160. These bits also appear in column 1 of the FIG. 6 table.

As the bits are interleaved with their position modulo 24 in the frame preserved, the parity control bytes are not corrupted.

The embodiment of the invention described above ensures that 83 bits (86 bits in the case of the 4th row) in the interleaved block are at least 25 bits apart in the deinterleaved block. This complies with a specification requiring that an error packet 80 bits long (Lmax) shall not prevent the recognition of a pointer.

Special processing can also be applied to ensure dispersion of the bits of pointers of the administrative unit AU-4 and the administrative units AU-32: the latter appear in the 4th row of the STM-1 frame, as shown in FIGS. 10A and 10B.

FIG. 10A shows the structure of the pointer PT of the administrative unit AU-4. It comprises nine bytes of which only the bytes H1, H2 and H3 form the pointer. Referring to FIG. 9, if the interleaving method described above is used, the bits of H1, H2 and H3 are assembled in groups of three by the interleaving operation. As one object of the invention is to disperse these bits, it is necessary before (or after) interleaving to carry out an operation on these bytes such that the bits are not grouped. The same problem arises with the pointer PT of the administrative unit AU-32 shown in FIG. 10B. The present invention therefore compacts the pointer area by modifying the position of at least two bytes of the pointer area so that after interleaving and compacting each pair of bits of the pointer is separated by at least Lmax, where Lmax is the length of an error packet that the transmission can withstand without any pointer errors. One example of compacting is described with reference to FIGS. 11A and 11B.

FIG. 11A shows the PT area of an STM-1 frame, the nine bytes of this part of the 4th row being labeled 4.1 through 4.9.

The invention compacts these bytes so that the interleaving operation disperses their bits in the interleaved frame. In a preferred embodiment of the invention this area has the structure shown in FIG. 11B after the compacting operation. Bytes 4.1, 4.5 and 4.9 remain at their previous location, bytes 4.2 and 4.4, 4.3 and 4.7, 4.6 and 4.8 being interchanged.

The result of this compacting of the PT areas in FIGS. 10A and 10B is shown in FIGS. 12A and 12B, respectively. The effect of subsequent interleaving will be to disperse the pointer bits, which is the required outcome.

Another problem then arises, however: the compacting operation modifies the positions of the bits at location modulo 24 with the result that the 24-tuplet B2 is corrupted. To be more precise, the byte B2.1 normally relates to bytes 4.1, 4.4 and 4.7 but after compacting these bytes are respectively 4.1, 4.2 and 4.3. Likewise, B2.2 and B2.4 normally relate to bytes 4.2, 4.5, 4.8 and 4.3, 4.6, 4.9, respectively, whereas the compacting operation replaces them with 4.4, 4.5, 4.6 and 4.7, 4.8, 4.9, respectively. This is why the method of the invention proposes to correct this 24-tuplet after the compacting operation by replacing the bytes B2.1, B2.2 and B2.3 with the bytes B2.1', B2.2' and B2.3', respectively, these bytes having the value:

B2.1'=B2.1–4.2–4.3+4.4+4.7

B2.2'=B2.2–4.4–4.6+4.2+4.8

B2.3'=B2.3–4.7–4.8+4.3+4.6

The corrections are written in logical form:

B2.1'=B2.1⊕4.2⊕4.3⊕4.4⊕4.7

B2.2'=B2.2⊕4.4⊕4.2⊕4.6⊕4.8

B2.3'=B2.3⊕4.7⊕4.3⊕4.8⊕4.6 where ⊕ is the exclusive-OR operator.

Correcting the 24-tuplet B2 before it is transmitted means that the parity control computation method implemented in the receiver can remain as defined by the standard.

The present invention also concerns a system for interleaving and deinterleaving STM-1 or STM-N SDH frame pointers transmitted between a transmitter and a receiver.

Figure 13:
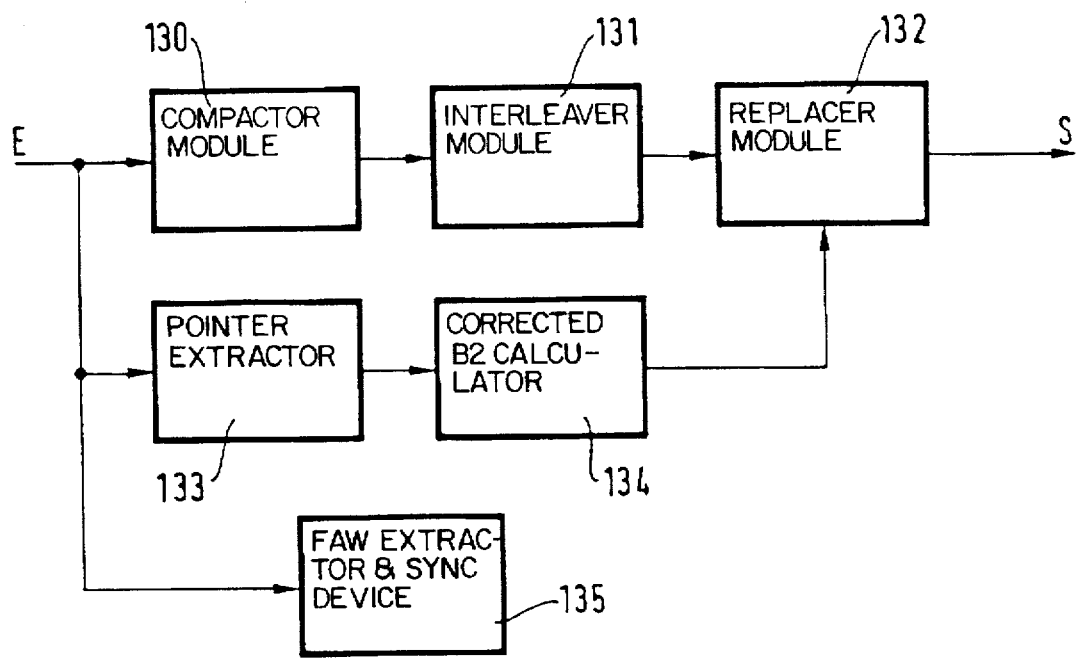
FIG. 13 is a block schematic of part of a transmitter of the invention.

FIG. 13 is a block schematic of part of a transmitter implementing the method of the invention.

The processor means shown in FIG. 13 include an input E for a frame to be interleaved and a frame alignment word extractor and synchronization device 135. A demultiplexed stream of STM-1 or STM-4 frames at 155/4 Mbit/s can be applied to the input E, for example. A compactor module 130 receives the signal E and compacts the bytes of the area PT. Compacting usually employs a compacting law whereby the position of at least two bytes of the pointer area is modified so that after interleaving and compacting each pair of bits of the pointer is separated by at least Lmax where Lmax is the length of an error packet that the transmission can withstand without any pointer errors. This compacting can advantageously be effected in the manner shown in FIG. 11B.

An interleaver module 131 receives the output signal from the compactor module 130 and interleaves bits of the pointer area and bits of the payload area in accordance with an interleaving law preserving the position modulo 24 of the interleaved bits, in accordance with the invention. Because of the compacting, and to avoid modifying the rule for calculating the parity control bytes, means 132, 133, 134 are provided for correcting the 24-tuplet B2 of the interleaved frame supplied by the module 131. These means include a module 133 for extracting the pointer in the area PT, a module 134 for calculating the corrected 24-tuplet B2 and a module 132 in which the 24-tuplet B2 present in the interleaved signal is replaced by the corrected 24-tuplet. The output signal S of the module 132 is the signal transmitted to the receiver of FIG. 14.

The transmission system can be a repeatered microwave link, for example, or a cable or optical fiber.

Figure 14:
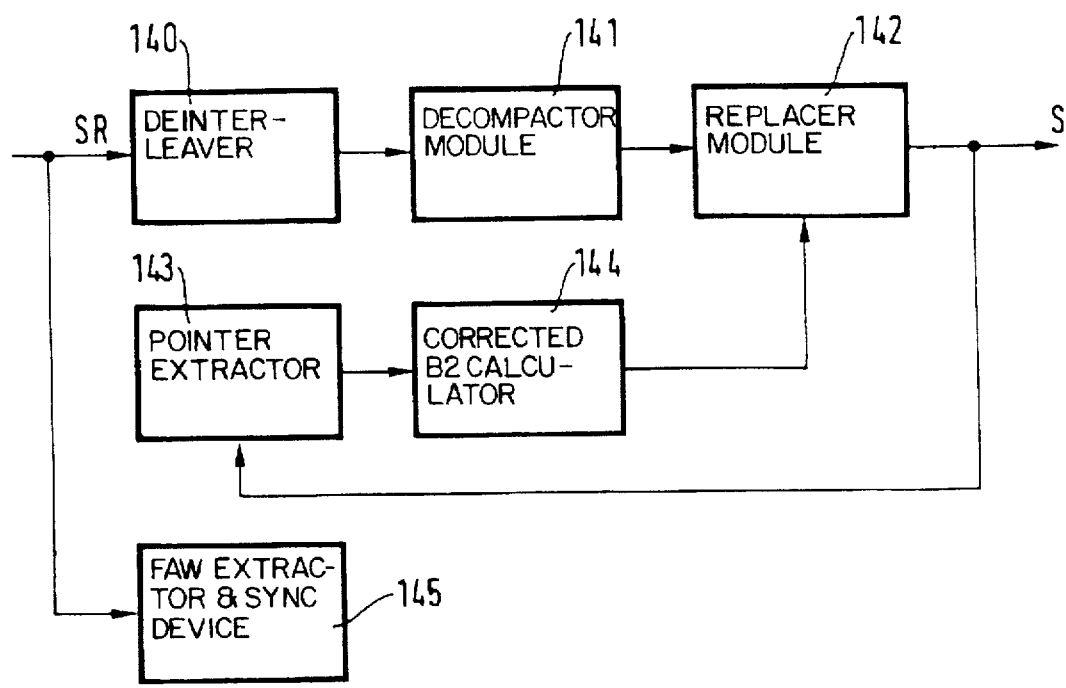
FIG. 14 is a block schematic of part of a receiver of the invention.

The FIG. 14 receiver includes means 140 for deinterleaving the signal SR which deinterleaves the interleaved frame received according to a law that is the reciprocal of the interleaving law. The object of this deinterleaving is therefore to regroup the bits that were dispersed by the interleaving. The deinterleaved frame is applied to a decompactor module 141 which decompacts the pointer area using a law that is the reciprocal of the compacting law.

Note that the compacting law described above also constitutes a decompacting law. Accordingly, the module 141 can be identical to the module 130.

The receiver also includes means for correcting the 24-tuplet B2 of the deinterleaved frame from the module 141. These means comprise a module 143 for extracting the pointer in the area PT of the deinterleaved frame (constituting the output signal S), a module 144 for calculating the corrected 24-tuplet B2 and a module 142 in which the 24-tuplet B2 in the deinterleaved signal is replaced by the corrected 24-tuplet. The receiver further includes a frame alignment word extractor and synchronization device 145.

The interleaving operation can evidently precede the compacting operation and the decompacting operation can evidently precede the deinterleaving operation. In practise, these operations are simultaneous.

The above description is not limiting in respect of the number of rows involved in the interleaving operations: it is possible to interleave two or more rows rather than treating only one row at a time, for example. Likewise, it is possible to interleave some of the data present in the section overhead SOH to the exclusion of the bytes B1 and B2.2, B2.2 and B2.3. However, interleaving bits of the RSOH then entails deinterleaving at each repeater between the transmitter and the receiver (terminations).

There is claimed:

1. Method of interleaving and deinterleaving STM-1 and STM-N SDH frame pointers transmitted between a transmitter and a receiver, each frame comprising three areas:

a section overhead area;

a pointer area;

a payload area including the data to be transmitted, in which method, at said transmitter, said interleaving consists in interleaving the bits of said pointer area and those of said payload area according to an interleaving law retaining the position modulo 24 in the interleaved bits, said interleaving producing an interleaved frame transmitted to said receiver at which said interleaved frame is deinterleaved using a law that is the reciprocal of said interleaving law.

2. Method according to claim 1 wherein said interleaving is associated with compacting of said pointer area in accordance with a compacting law by modifying the position of at least two bytes of said pointer area so that after interleaving and compacting each pair of bits of said pointer is separated by at least the length of an error packet that the transmission can withstand without any pointer errors, said interleaving being associated with decompacting in accordance with a law that is the reciprocal of the compacting law.

3. Method according to claim 2 including correcting the 24-tuplet B2 after said compacting and said interleaving and after said deinterleaving and said decompacting.

4. System for interleaving and deinterleaving STM-1 and STM-N SDH frame pointers transmitted between a transmitter and a receiver, each frame comprising three areas:

a section overhead area;

a pointer area;

a payload area including the data to be transmitted, said transmitter including an interleaver module for interleaving the bits of said pointer area and those of said payload area according to an interleaving law retaining the position modulo 24 in the interleaved bits, said interleaving producing an interleaved frame transmitted to said receiver, and said receiver including a deinterleaver module for deinterleaving said interleaved frame using a law that is reciprocal of said interleaving law.

5. System according to claim 4 wherein said transmitter includes a compactor module for compacting said pointer area in accordance with a compacting law by modifying the position of at least two bytes of said pointer area so that after interleaving and compacting each pair of bits of said pointer area is separated by at least the length of an error packet that the transmission can withstand without any pointer errors, said receiver including a decompactor module for decompacting said pointer area in accordance with a law that is the reciprocal of said compacting law.

6. System according to claim 5 wherein said transmitter includes means for correcting the 24-tuplet B2 of said interleaved frame and said receiver includes means for correcting said 24-tuplet B2 of said deinterleaved frame.

7. Transmitter for a system for interleaving and deinterleaving STM-1 and STM-N SDH frame pointers transmitted between a transmitter and a receiver, each frame comprising three areas:

a section overhead area;

a pointer area;

a payload area including the data to be transmitted, said transmitter including an interleaver module for interleaving the bits of said pointer area and those of said payload area according to an interleaving law retaining the position modulo 24 in the interleaved bits, said interleaving producing an interleaved frame transmitted to said receiver, and said receiver including a deinterleaver module for deinterleaving said interleaved frame using a law that is reciprocal of said interleaving law.

8. Transmitter according to claim 7 further including a compactor module for compacting said pointer area in accordance with a compacting law by modifying the position of at least two bytes of said pointer area so that after interleaving and compacting each pair of bits of said pointer is separated by at least the length of an error packet that the transmission can withstand without any pointer errors and wherein said receiver includes a decompactor module for decompacting said pointer area in accordance with a law that is the reciprocal of said compacting law.

9. Transmitter according to claim 8 further including means for correcting the 24-tuplet B2 of said interleaved frame and wherein said receiver includes means for correcting said 24-tuplet B2 of said deinterleaved frame.

* * * * *